(12) United States Patent
Lee

(10) Patent No.: US 6,259,172 B1
(45) Date of Patent: Jul. 10, 2001

(54) COOLING FAN CONTROLLING APPARATUS FOR COMPUTER

(75) Inventor: Kyung-sang Lee, Suwon (KR)

(73) Assignee: SamSung Electronics Co., Ltd., Suwon (KR)

(*) Notice: Subject to any disclaimer, the term of this patent is extended or adjusted under 35 U.S.C. 154(b) by 0 days.

(21) Appl. No.: 09/353,788

(22) Filed: Jul. 15, 1999

(30) Foreign Application Priority Data

Jul. 15, 1998 (KR) .................................................. 98-28653

(51) Int. Cl.[7] ............................................... H01H 35/00
(52) U.S. Cl. ..................... 307/125; 307/116; 307/130; 361/695; 700/70
(58) Field of Search ............................. 307/125, 80, 113, 307/115, 139, 50, 116, 130; 361/690, 691, 692, 693, 697, 695; 700/70

(56) References Cited

U.S. PATENT DOCUMENTS

| | | |
|---|---|---|
| 5,270,623 * | 12/1993 | Ohta et al. ............................. 318/268 |
| 5,513,361 | 4/1996 | Young . |
| 5,687,079 | 11/1997 | Bauer et al. . |
| 5,764,506 | 6/1998 | Eynaud . |
| 5,848,282 * | 12/1998 | Kang ................................ 395/750.05 |
| 5,881,298 | 3/1999 | Cathey . |
| 5,990,582 * | 11/1999 | Henderson et al. .................. 307/139 |

* cited by examiner

Primary Examiner—Josie Ballato
Assistant Examiner—Robert L. DeBeradinis
(74) Attorney, Agent, or Firm—Robert E. Bushnell, Esq.

(57) ABSTRACT

A cooling fan controlling apparatus for a computer including a power management portion for managing a power management system (PMS) mode of the computer, and a switching portion having n parallel-connected resistors and n switches serially connected to the resistors and turned on/off according to the power management system mode managed by the power management portion, and serially connected to a power source for driving a cooling fan, for controlling a voltage supplied to the cooling fan, where n is an integer greater than or equal to 2. Since voltages for driving a switching mode power supply cooling fan and a central processing unit cooling fan can be controlled by power save mode steps of a system, noises generated when the cooling fans rotate can be properly managed.

30 Claims, 4 Drawing Sheets

COOLING FAN CONTROLLING APPARATUS FOR COMPUTER

CLAIM OF PRIORITY

This application makes reference to, incorporates the same herein, and claims all benefits accruing under 35 U.S.C. § 119 and § 120 from an application entitled Cooling Fan Controlling Apparatus For Computer earlier filed in the Korean Industrial Property Office on the Jul. 15, 1998, and there duly assigned Ser. No. 98-28653, a copy of which is annexed hereto.

BACKGROUND OF THE INVENTION

1. Technical Field

The present invention relates to a computer, and more particularly to an apparatus controlling a cooling fan for a power supply system and a central processing unit in accordance with a power save mode of a power management system.

2. Related Art

As a computer system becomes smaller and more portable, a power save function by which the computer system can be used for a longer time by a battery with a limited capacity has become important. Accordingly, the power save function of a computer is classified into a normal mode, a standby mode, and a suspend mode according to the use of the system and a predetermined time. During the standby mode, a spindle motor of a hard disk driver is interrupted and a monitor screen is turned off, thereby achieving a power saving effect.

Background information regarding computer systems is as follows. Computer systems are information handling systems that are utilized by many individuals and businesses today. A computer system can be defined as a microcomputer that includes a central processing unit (CPU), a volatile memory, a non-volatile memory such as read only memory (ROM), a display monitor, a keyboard, a mouse or other input device such as a trackball, a floppy diskette drive, a compact disc-read only memory (CD-ROM) drive, a modem, a hard disk storage device, and a printer. A computer system's main board, which is a printed circuit board known as a motherboard, is used to electrically connect these components together. A computer system can be a desktop computer, a personal computer, a portable computer such as a notebook computer or palm-sized computer, or other type of computer.

Computer systems include a basic input output system (BIOS) which is an especially important program stored in read only memory. The basic input output system tests a computer every time the computer is powered on. The basic input output system can allocate a computer system's resources automatically, making adjustments needed to accommodate new hardware. Also, the basic input output system governs how system board components interact. When the computer system is powered on, the basic input output system immediately takes control of the computer system and its components. The first duty of the basic input output system is to perform a series of diagnostic routines called the power on self test (POST) routine, which ensures that every part of the computer system's hardware is functioning properly.

I have found that cooling fans in computers use energy and produce noise. This use of energy can be wasteful and production of noise can be unnecessary when a cooling fan is operated even though a central processing unit of a computer system is not in use. Efforts have been made to control a fan in a computer.

Exemplars of recent efforts in the art include U.S. Pat. No. 5,848,282 for Computer System With a Control Function of Rotation Speed of a Cooling Fan For a Microprocessor Chip Therein And a Method of Controlling The Cooling Fan issued to Kang, U.S. Pat. No. 5,881,298 for Portable Computer with Selectively Operable Cooling Unit issued to Cathey, U.S. Pat. No. 5,513,361 for Method and Apparatus for Reducing Power Consumption of a Fan in a Computer System issued to Young, U.S. Pat. No. 5,764,506 for Method and Apparatus for Reducing the Sound Level of a Microcomputer issued to Eynaud, and U.S. Pat. No. 5,687,079 for Method and Apparatus for Improved Control of Computer Cooling Fan Speed issued to Bauer et al.

While these recent efforts provide advantages, I note that they fail to adequately provide an efficient and convenient cooling fan controlling apparatus for a computer.

SUMMARY OF THE INVENTION

To solve the above problems, it is an objective of the present invention to provide a cooling fan controlling apparatus which controls cooling fans of a computer in accordance with different power management system modes such as a normal operating mode, a standby mode, a suspend mode, a power-off mode, and additional power modes, in order to conserve energy.

To solve the above problems, it is a further objective of the present invention to provide a cooling fan controlling apparatus which controls cooling fans of a computer in accordance with different power management system modes such as a normal operating mode, a standby mode, a suspend mode, a power-off mode, and additional power modes, in order to reduce noise.

To solve the above problems, it is still a further objective of the present invention to provide a cooling fan controlling apparatus of a computer according to power management system (PMS) modes, by which unnecessary noise can be reduced by appropriately controlling the revolutions per minute (RPMs) of at least two fans, wherein a first fan corresponds to a switching mode power supply (SMPS) cooling fan and a second fan corresponds to a central processing unit cooling fan.

To solve the above problems, it is an additional objective of the present invention to provide a cooling fan controlling apparatus of a computer according to power management system (PMS) modes, by which the life time of at least two cooling fans can be prolonged, and a power saving effect can be maximized, wherein a first fan corresponds to a switching mode power supply (SMPS) cooling fan and a second fan corresponds to a central processing unit cooling fan.

Accordingly, to achieve the above objectives and other objectives, there is provided a cooling fan controlling apparatus for a computer including a power management portion for managing a power management system mode of the computer, and a switching portion having n parallel-connected resistors and n switches serially connected to the resistors and turned on/off according to the power management system mode managed by the power management portion, and serially connected to a power source for driving a cooling fan, for controlling a voltage supplied to the cooling fan, where n is an integer greater than or equal to 2.

According to another aspect of the present invention, there is provided a personal computer having a memory in which application programs and a plurality of programs including an operating system program and a basic input/ output system (BIOS) program are stored, a microprocessor for executing the plurality of programs, and a power supply system for receiving external alternating current (AC) power and converting the same into various kinds of direct current (DC) power, wherein the personal computer further comprises a cooling fan controlling apparatus including a power management portion for managing a power management system mode of the computer, and a power supply cooling fan driving voltage switching portion having n parallel-connected resistors and n switches serially connected to the resistors and turned on/off according to the power management system mode managed by the power management portion, and serially connected to a power source for driving a cooling fan provided in the power supply system, for controlling a voltage supplied to the cooling fan, where n is an integer greater than or equal to 2.

To achieve these and other objects in accordance with the principles of the present invention, as embodied and broadly described, the present invention provides an apparatus, comprising: a fan unit being positioned to cool a computer system; a power management unit controlling a power mode of said computer system; a switching unit being coupled to said power management unit, said switching unit receiving power for driving said fan unit, said switching unit controlling a voltage supplied to said fan unit according to said power mode controlled by said power management unit; a plurality of resistors being mounted in said switching unit, said plurality of resistors receiving said power for driving said fan unit, said plurality of resistors being connected in parallel; and a plurality of switches being mounted in said switching unit, each one switch selected from among said plurality of switches being connected in series with a respective one resistor selected from among said plurality of resistors, said plurality of switches being switched on and off according to said power mode controlled by said power management unit, said plurality of switches being disposed between said fan unit and said plurality of resistors.

To achieve these and other objects in accordance with the principles of the present invention, as embodied and broadly described, the present invention provides an apparatus, comprising: a power supply unit supplying power to a computer system having a central processing unit; a power management unit receiving power from said power supply unit, said power management unit controlling a power mode of said computer system; and at least one switching unit receiving power, said at least one switching unit being coupled to said power management unit, said at least one switching unit switching on and off according to said power mode controlled by said power management unit; a first fan receiving from said at least one switching unit a first voltage controlled by said at least one switching unit, said first fan being positioned to cool said central processing unit; and a second fan receiving from said at least one switching unit a second voltage controlled by said at least one switching unit, said second fan being positioned to cool said power management unit.

To achieve these and other objects in accordance with the principles of the present invention, as embodied and broadly described, the present invention provides an apparatus, comprising: a fan unit being positioned to cool a computer system; a power management unit controlling a power mode of said computer system; a switching unit being coupled to said power management unit, said switching unit receiving a first power for driving said fan unit, said switching unit controlling a second power supplied to said fan unit according to said power mode controlled by said power management unit; a first plurality of resistors being mounted in said switching unit, said first plurality of resistors receiving said power for driving said fan unit, said first plurality of resistors being connected in parallel; and a first plurality of switches being mounted in said switching unit, each one switch selected from among said first plurality of switches being connected in series with a respective one resistor selected from among said first plurality of resistors, said first plurality of switches being switched on and off according to said power mode controlled by said power management unit, said first plurality of switches being disposed between said fan unit and said first plurality of resistors.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to exemplify the principles of this invention.

DESCRIPTION OF THE PREFERRED EMBODIMENTS

Figure 1:
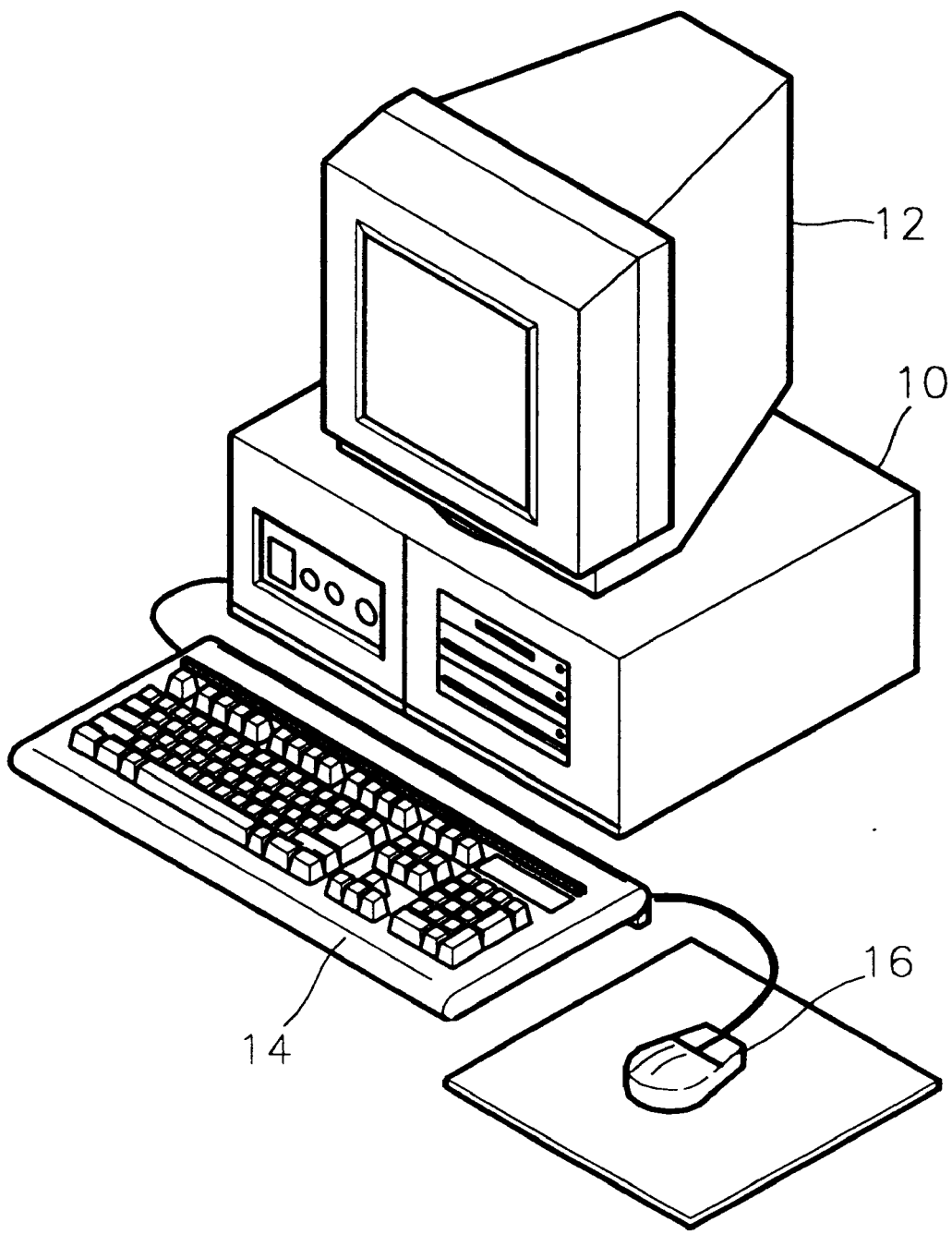
FIG. 1 is a diagram illustrating the outer appearance of a computer system.

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

The Advanced Configuration and Power Interface (ACPI) has been defined as the specification about the hardware and software of a computer for standardizing an operating system directed power management (OSPM). The Advanced Configuration and Power Interface classifies the power state in more various types. According to the Advanced Configuration and Power Interface, the state of a system is globally classified into a working (G0) state in which the system works normally, a sleeping (G1) state in which the system is not substantially executing a command, that is, the system is in a power save state and the system is restored into the G0 state when a wave-up event is generated, a soft-off (G2/S5) state in which booting is necessary for the system to be restored into the G0 state while consuming the minimum power, and a mechanical off (G3) state in which power supply is completely interrupted by a hardware switch.

The sleeping state is classified again into an idle (S1) state in which all hardware system contexts are maintained, a global standby (S2) state in which the contexts of a central processing unit and a cache are not maintained, a suspend-to-random access memory (suspend-to-RAM) (S3) state in which only the hardware context of a system memory is maintained, and a suspend-to-disk (S4) state in which the hardware contexts are not maintained at all but are stored in a disk. The aforementioned contexts can correspond to environment or settings, for example. Also, according to the Advanced Configuration and Power Interface, the possible states of the central processing unit during the G0 mode are divided into C0, C1, C2 and C3, and the power states of an individual system during G0 and G1 modes are divided into D0, D1, D2 and D3.

As described above, the Advanced Configuration and Power Interface specification is expected to be adopted by many operating systems to be developed in the future. Specifically, the Windows 98(R) operating system developed by Microsoft Corporation adopts the Advanced Configuration and Power Interface, thereby implementing an On-Now function that a computer system is ready to be used immediately after a user presses a power switch.

A controlling method of the cooling fan is performed irrespective of various power management system modes. In order to cool the heat generated at a power supply system, i.e., switching mode power supply (SMPS), a thermistor for detecting the temperature depending on changes in consumed power of a system is installed at a predetermined position of the switching mode power supply. According to changes in resistance values of the thermistor, input voltages of the switching mode power supply cooling fan change, and RPM (revolutions per minute) of the switching mode power supply cooling fan and noise are controlled accordingly. However, it is hard to find a technology for controlling revolutions per minute of the switching mode power supply cooling fan separately.

Therefore, one can say that while the switching mode power supply operates, the switching mode power supply cooling fan cannot be turned off at all. Also, since the revolutions per minute of the central processing unit cooling fan cannot be controlled appropriately according to the power state of the system, unnecessary noise is generated and a life time of the cooling fan is shortened in a long term.

Turn now to FIG. 1, which shows the outer appearance of a computer system. FIG. 1 is a diagram illustrating the outer appearance of a computer system which can also be referred to as a personal computer (PC). Referring to FIG. 1, the personal computer includes a main body 10 and an input/output device. The basic input/output device includes a monitor 12, a keyboard 14, and a mouse 16. In the main body 10, a central processing unit (CPU), a memory, a disk driver, a video controller, a keyboard controller and additional elements are installed.

Figure 2:
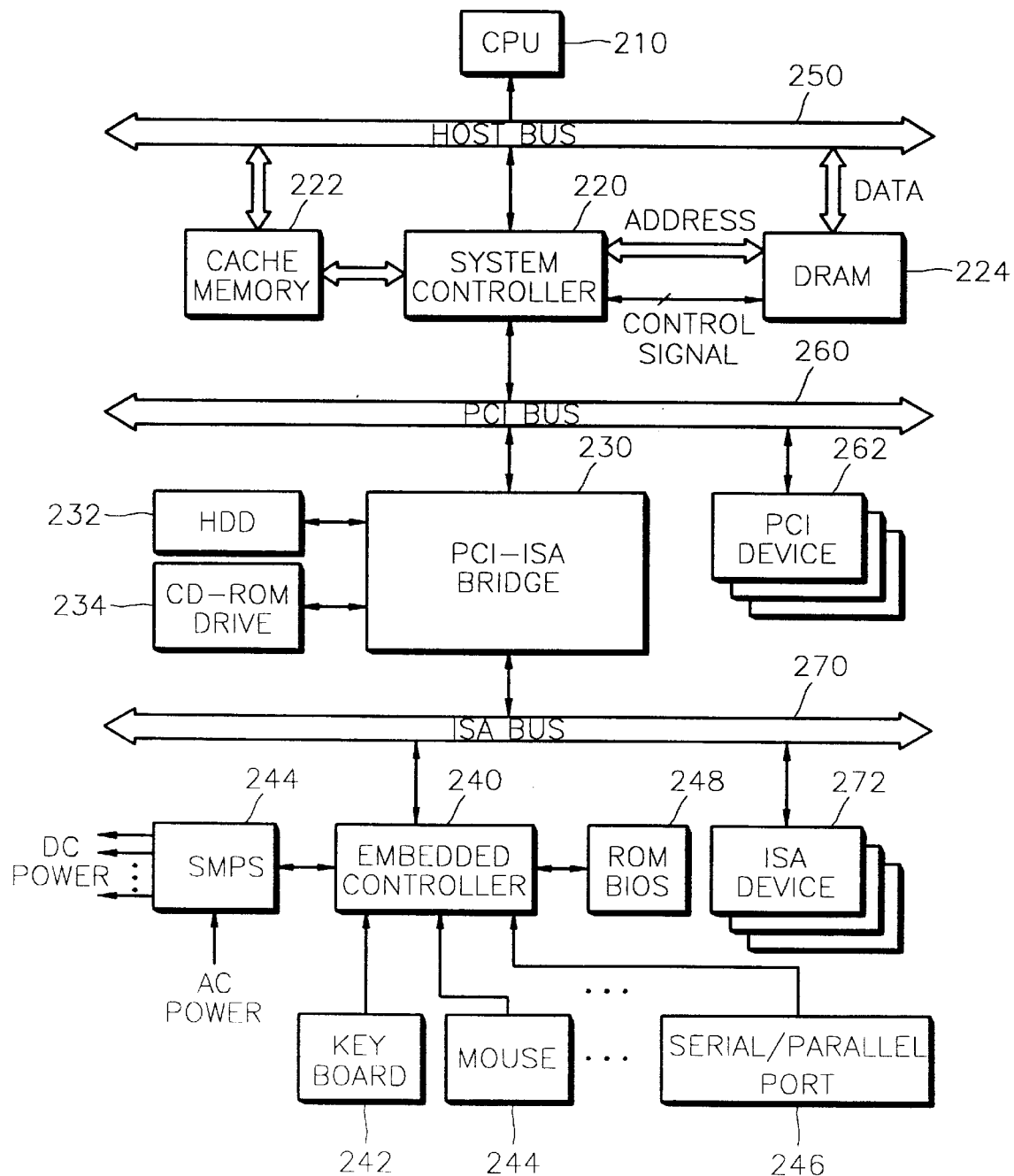
FIG. 2 is an internal block diagram of the computer system of FIG. 1.

Turn now to FIG. 2, which shows an internal block diagram of the computer system of FIG. 1. FIG. 2 is an internal block diagram of the personal computer of FIG. 1, which includes a central processing unit (CPU) 210, a system controller 220, a peripheral component interconnect-industry standard architecture (PCI-ISA) bridge 230, and an embedded controller 240.

The system controller 220 is connected to a cache memory 222 and a dynamic random access memory (DRAM) 224, and includes a bridge connecting a host bus 250 for being connected with the central processing unit (CPU) 210 and a peripheral component interconnect (PCI) bus 260 for being connected with PCI devices 262, and a cache memory controller.

The PCI-ISA bridge 230 connects a PCI bus 260 and an industry standard architecture (ISA) bus 270 for connecting with ISA devices 272, and includes an integrated device electronics (IDE) controller for controlling a hard disk drive (HDD) 232 and/or an optical disk such as a compact disk-read only memory (CD-ROM) drive 234.

The embedded controller 240 is a kind of microcomputer, to which an input portion including a keyboard 242, a mouse 244, and serial/parallel ports 246, and a read only memory-basic input/output system (ROM-BIOS) 248 are connected, and is connected to the PCI-ISA bridge 230 through the ISA bus 270. Also, the embedded controller 240 detects an event from input/output devices to generate a system management interrupt (SMI) and controls the switching mode power supply to be turned on/off. Particularly, an embedded controller based on an ACPI-specification supports embedded controller commands set for directly communicating with an Advanced Configuration and Power Interface (ACPI) operating system, detects the generation of an event a system control interrupt (SCI) to then be notified to the operating system.

Figure 3:
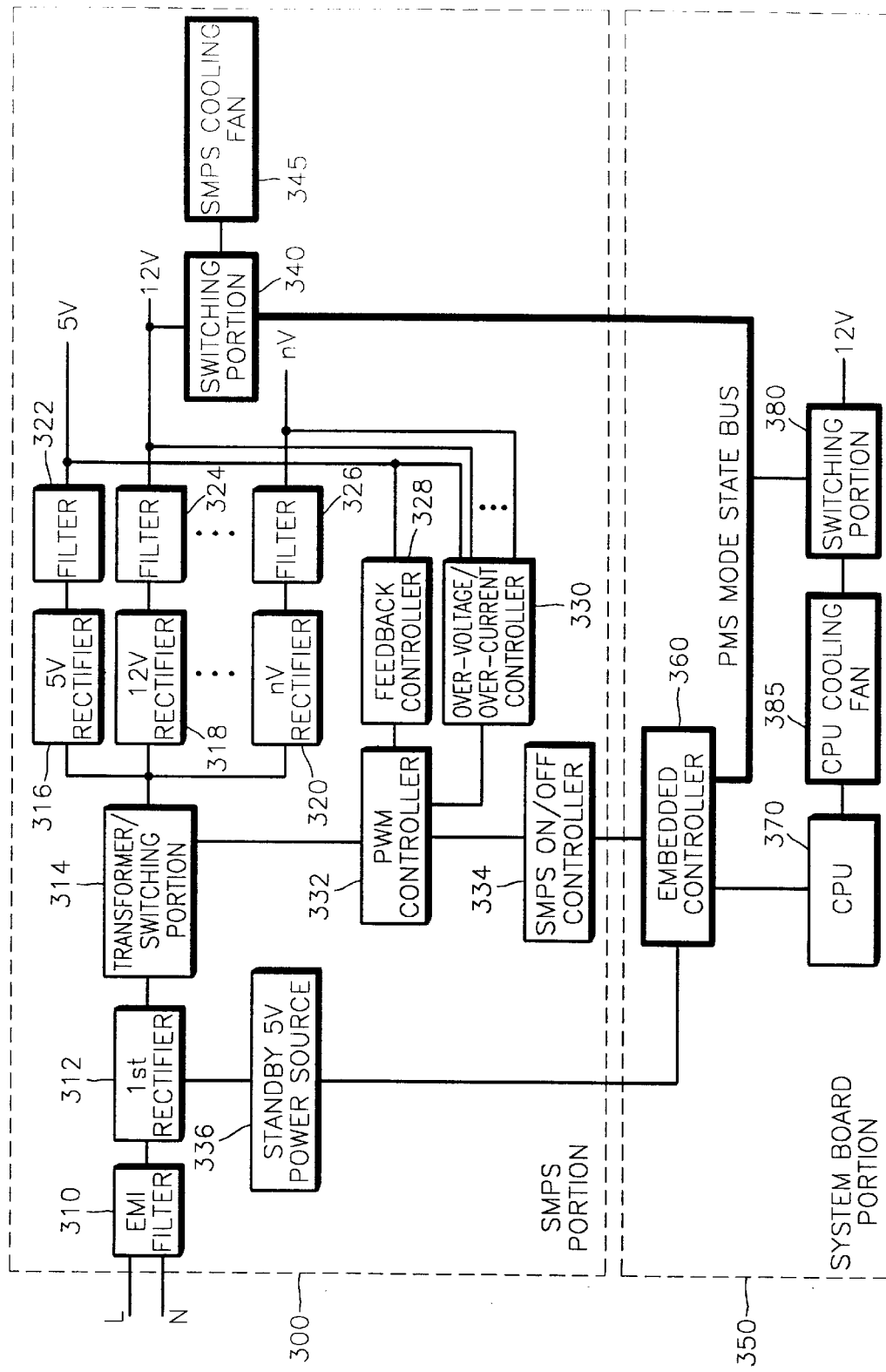
FIG. 3 is a schematic diagram illustrating a computer system having a cooling fan controlling apparatus, in accordance with the principles of the present invention.

Turn now to FIG. 3, which shows a schematic diagram illustrating a computer system having a cooling fan controlling apparatus, in accordance with the principles of the present invention. Referring to FIG. 3, the cooling fan controlling apparatus for a personal computer includes an embedded controller 360 installed in a system board portion 350 and a switching portion 340 for controlling a cooling fan 345 installed in a switching mode power supply (SMPS) portion 300. First, the switching mode power supply portion 300 will be described. An electro-magnetic interference filter 310 is a high frequency wave filter which prevents various noises generated when the switching mode power supply portion 300 performs a high frequency wave switching operation, and a noise induced from system clocks from being conducted through a power supply line, or prevents a noise loaded in the power supply line from being induced to the inside of the switching mode power supply portion 300. A first rectifier 312 step-up transforms and full-wave rectifies a normal alternating current (AC) voltage of 110 volts (V) or 220 volts and converts the same into a direct current (DC) voltage of 310 volts. A transformer/switching portion 314 down-converts the 310 volt DC voltage rectified from the first rectifier 312 according to a switch on/off duty and a winding ratio. The transformer/switching portion 314 insulates a primary circuit and a secondary circuit safely for the sake of user's safety. Rectifiers 316, 318, and 320 are separately provided according to voltages, for example, +3.3 volts, +5 volts, +12 volts, −5 volts, −12 volts, etc. of output sides as the outputs of the switching mode power supply portion 300. In other words, the rectifiers 316, 318, and 320 rectify pulses stepped-down by the transformer/switching portion 314. Filters 322, 324, and 326 smooth the direct current (DC) voltages rectified by the rectifiers 316, 318, and 320 into complete direct current levels. A feedback controller 328 controls a switching duty of the switching mode power supply 300 by sensing a change in voltages of a main output port (corresponding to a 5 volt output port in this embodiment), changing the same into a current energy and transmitting the current energy to a pulse width modulation (PWM) controller 332. An overvoltage/over-current controller 330 is a circuit for preventing a voltage greater than a rated voltage from being output due to improper control of the feedback control 328, and for avoiding breaking of an electronic device or fire occurring when malfunction of the switching mode power supply portion 300 having multiple output ports is generated. The pulse width modulation controller 332 is an essential part of the switching mode power supply portion 300 and controls an on/off duty of the trans former/switching portion 314 so as to supply a stable output even at changes in output loads or input loads. A switching mode power supply on/off controller 334 turns power on when the computer system is used, and turns power off when the computer system is not used.

An alternating current (AC) utility power supply line can be directly controlled to be turned on or off. However, a soft switch function can be used for the purpose of attaining system reliability and user's convenience. A standby 5 volt power supply portion 336 operates by auxiliary power, separately from the main power for the switching mode power supply portion 300, and supplies power to a circuit for detecting a wake-up event, including the embedded controller 360 of the system board portion 350. In other words, the standby 5 volt power supply portion 336 is used as a power source for detecting the activity of input/output devices and fax/modem personal computer for waking the mode from a suspend mode to a normal mode and driving a soft switch.

The embedded controller 360 mounted in the system board portion 350 corresponds in some ways to the embedded controller 240 shown in FIG. 2, controls a power save mode using a timer, and detects a signal for waking up the personal computer from the power save mode to a normal mode and operational states of the input/output devices, thereby performing switching mode power supply on/off control and power management function. In the present invention, the embedded controller 360 may be the power management system in which the power supply mode is managed by a normal mode, a standby mode, and a suspend mode, or the embedded controller 360 may be the power management system according to the Advanced Configuration and Power Interface specification. The embedded controller 360 transmits the information on a power management system mode managed by itself to the switching portion 340 for controlling the revolutions per minute (RPMs) of the cooling fan 345 of the switching mode power supply portion 300.

Figure 4:
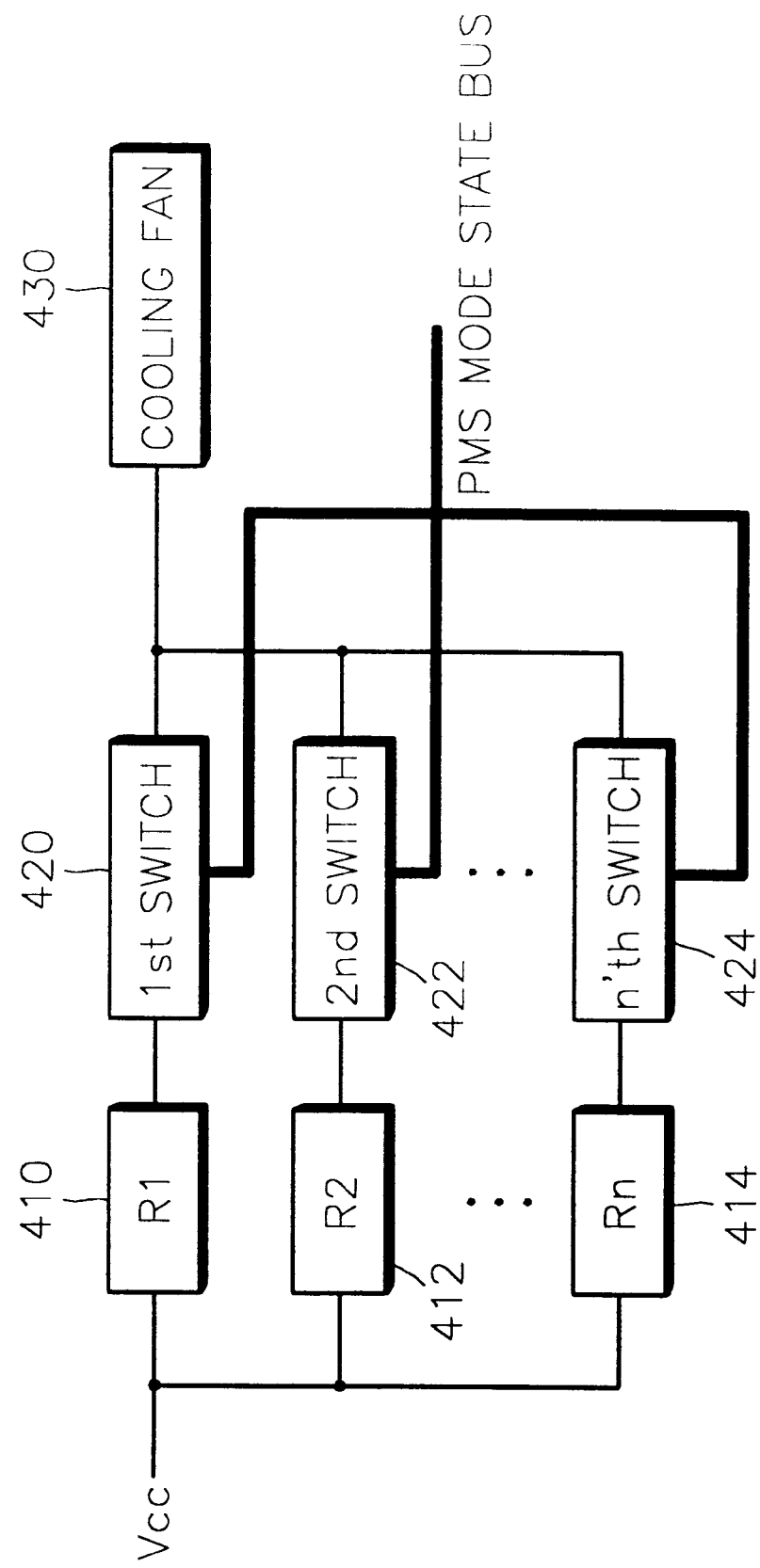
FIG. 4 is a detailed schematic diagram illustrating a switching portion shown in FIG. 3, in accordance with the principles of the present invention.

Turn now to FIG. 4, which shows a detailed schematic diagram illustrating a switching portion 340 shown in FIG. 3, in accordance with the principles of the present invention. Referring to FIG. 4, the switching portion (340 of FIG. 3) includes n resistors 410, 412, and 414 parallel connected to a power supply line supplied to the cooling fan 430 and n switches 420, 422, and 424 serially connected to the respective resistors 410, 412, and 414. The switches 420, 422, and 424 are turned on or off according to a value of a power management system mode state bus for notifying the power management system mode managed by the embedded controller 360 shown in FIG. 3.

Thus, whenever the system mode is in turn changed to the normal mode, the standby mode, and to the suspend mode or to the G0, S1, S2, . . . , G2/S2 states, the parallel-connected switches 420, 422, and 424 can be controlled, respectively. The switches 420, 422, and 424 may be constructed separately by the respective power management system modes according to embodiments, or may be constructed by a combination of several power management system modes.

In such a manner, the values of the resistors serially connected to the cooling fan 430 can be varied according to the power management system mode, which leads to a change in voltages supplied to the cooling fan 430, thereby adjusting the revolutions per minute of the cooling fan 430.

Referring back to FIG. 3, the cooling fan controlling apparatus for a computer system according to the present invention may further include a switching portion 380 for controlling the revolutions per minute (RPMs) of a central processing unit cooling fan 385 for removing heat generated from the central processing unit (CPU) 370. In other words, the power management system mode information managed by the embedded controller 360 is transmitted to the switching portion 380 for the central processing unit cooling fan 385 as well as to the switching portion 340 for the switching mode power supply portion 300 through the power management system mode state bus.

The switching portion 380 for the central processing unit cooling fan 385 has the similar structure as shown in FIG. 4. However, the numbers of resistors and switches and the respective resistance values may be different from those of the switching portion 340 of the switching mode power supply portion 300.

According to the present invention, first, since voltages for driving a switching mode power supply cooling fan and a central processing unit cooling fan can be controlled by power save mode steps of a system, noises generated when the cooling fans rotate can be properly managed.

Second, power saving effects can be maximized by appropriately reducing the revolutions per minute of the switching mode power supply cooling fan and the central processing unit cooling fan. Also, the life time of a cooling fan is prolonged by reducing the overall revolutions per minute of the cooling fans.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. An apparatus, comprising:

a power supply unit inputting a first power and outputting a plurality of second powers powering a computer system, said power supply unit generating heat;

a first fan unit being positioned to cool said power supply unit;

a second fan unit being positioned to cool a central processing unit of the computer system;

a control unit controlling a power mode of the computer system, said power mode being one selected from among a plurality of different power modes; and a first switching unit being coupled to said control unit and said first and second fan units, said first switching unit receiving a control signal from said control unit corresponding to said power mode of the computer system, said first switching unit receiving power driving said first and second fan units, said first switching unit controlling a voltage supplied to said first and second fan units in response to said control signal, said first and second fan units operating at cooling speeds selected from among a plurality of different cooling speeds, said selected cooling speeds of said first and second fan units being selected in response to the voltage supplied from said first switching unit.

2. The apparatus of claim 1, said power supply unit corresponding to a switching mode power supply unit.

3. The apparatus of claim 1, said power mode corresponding to one power level selected from among a plurality of power levels comprising:

a power-on mode supplying a fill level of electrical power to the computer system for full operational use of the computer system;

a standby mode supplying a first intermediate level of electrical power to the computer system, said first intermediate level of electrical power being below said full level of electrical power;

a suspend mode supplying a second intermediate level of electrical power to the computer system, said second intermediate level of electrical power being below said first intermediate level of electrical power; and a power-off mode supplying a low level of electrical power to the computer system, said low level of electrical power being below said second intermediate level of electrical power.

4. The apparatus of claim 3, said selected cooling speed of said first fan unit corresponding to a high speed rapidly cooling said power supply unit when said power mode of the computer system corresponds to said power-on mode.

5. The apparatus of claim 4, said selected cooling speed of said first fan unit corresponding to a low speed slowly cooling said power supply unit when said power mode of the computer system corresponds to said standby mode.

6. The apparatus of claim 5, said first switching unit further comprising:

a plurality of resistors being mounted in said first switching unit, said plurality of resistors receiving the power driving said first fan unit, said plurality of n resistors being connected in parallel; and a plurality of switches being mounted in said first switching unit, each one switch selected from among said plurality of switches being connected in series with a respective one resistor selected from among said plurality of resistors, said plurality of switches being switched on and off according to said power mode controlled by said control unit in dependence upon said control signal, said control signal corresponding to a power management system mode control signal.

7. The apparatus of claim 6, said plurality of resistors corresponding to a quantity of n resistors, said plurality of switches corresponding to a quantity of n switches, where n is an integer greater than 1.

8. The apparatus of claim 3, said selected cooling speed of said first fan unit corresponding to a low speed slowly cooling said power supply unit when said power mode of the computer system corresponds to said standby mode.

9. The apparatus of claim 1, said power mode corresponding to one mode selected from among a plurality of modes comprising:

a working mode supplying a fall level of electrical power to the computer system for full operational use of the computer system;

a sleeping mode corresponding to a first power save state, the computer system being restored to said working mode from said sleeping mode in response to a control signal; and a soft-off mode corresponding to a second power save state, the computer system being restored to said working mode from said soft-off mode while consuming a reduced amount of power in response to a booting of the computer system.

10. The apparatus of claim 9, said sleeping mode further comprising:

an idle state having all hardware system settings of the computer system being maintained;

a global standby state having settings of a central processing unit and a cache being not maintained;

a suspend to memory state having only hardware settings of a system memory being maintained by being stored in a random access memory; and a suspend to disk state having said all hardware system settings of the computer system being not maintained, said all hardware system settings of the computer system being stored in a disk.

11. An apparatus, comprising:

a power supply unit inputting a first power and outputting a plurality of second powers powering a computer system, said power supply unit generating heat;

a first fan unit being positioned to cool said power supply unit;

a central processing unit processing data in the computer system, said central processing unit generating heat;

a second fan unit being positioned to cool said central processing unit;

a control unit controlling a power mode of the computer system, said power mode being one selected from among a plurality of different power modes;

a first switching unit being coupled to said control unit and said first fan unit, said first switching unit receiving a control signal from said control unit corresponding to said power mode of the computer system, said first switching unit receiving power driving said first fan unit, said first switching unit controlling a voltage supplied to said first fan unit in response to said control signal, said first fan unit operating at a cooling speed selected from among a plurality of different cooling speeds, said selected cooling speed of said first fan unit being selected in response to the voltage supplied from said first switching unit; and a second switching unit being coupled to said control unit and said second fan unit, said second switching unit receiving said control signal from said control unit corresponding to said power mode of the computer system, said second switching unit receiving power driving said second fan unit, said second switching unit controlling a voltage supplied to said second fan unit in response to said control signal, said second fan unit operating at a cooling speed selected from among a plurality of different cooling speeds, said selected cooling speed of said second fan unit being selected in response to the voltage supplied from said second switching unit.

12. The apparatus of claim 11, said selected cooling speed of said first fan unit being different from said selected cooling speed of said second fan unit.

13. The apparatus of claim 12, said power mode corresponding to one power level selected from among a plurality of power levels comprising:

a power-on mode supplying a full level of electrical power to the computer system for full operational use of the computer system;

a standby mode supplying a first intermediate level of electrical power to the computer system, said first intermediate level of electrical power being below said full level of electrical power;

a suspend mode supplying a second intermediate level of electrical power to the computer system, said second intermediate level of electrical power being below said first intermediate level of electrical power; and a power-off mode supplying a low level of electrical power to the computer system, said low level of electrical power being below said second intermediate level of electrical power.

14. The apparatus of claim 13, said selected cooling speed of said first fan unit corresponding to a low speed slowly cooling said power supply unit when said power mode of the computer system corresponds to said standby mode.

15. The apparatus of claim 11, said power mode corresponding to one power level selected from among a plurality of power levels comprising:

a power-on mode supplying a full level of electrical power to the computer system for full operational use of the computer system;

a standby mode supplying a first intermediate level of electrical power to the computer system, said first intermediate level of electrical power being below said full level of electrical power;

a suspend mode supplying a second intermediate level of electrical power to the computer system, said second intermediate level of electrical power being below said first intermediate level of electrical power; and a power-off mode supplying a low level of electrical power to the computer system, said low level of electrical power being below said second intermediate level of electrical power.

16. The apparatus of claim 15, said selected cooling speed of said first fan unit corresponding to a low speed slowly cooling said power supply unit when said power mode of the computer system corresponds to said standby mode.

17. The apparatus of claim 11, said power mode corresponding to one mode selected from among a plurality of modes comprising:

a working mode supplying a full level of electrical power to the computer system for full operational use of the computer system;

s a sleeping mode corresponding to a first power save state, the computer system being restored to said working mode from said sleeping mode in response to a control signal; and a soft-off mode corresponding to a second power save state, the computer system being restored to said working mode from said soft-off mode while consuming a reduced amount of power in response to a booting of the computer system.

18. The apparatus of claim 17, said selected cooling speed of said first fan unit corresponding to a high rotation speed rapidly cooling said power supply unit when said power mode of the computer system corresponds to said working mode.

19. The apparatus of claim 18, said selected cooling speed of said first fan unit corresponding to a low rotation speed slowly cooling said power supply unit when said power mode of the computer system corresponds to said sleeping mode, said low speed being lower than said high speed.

20. The apparatus of claim 17, said sleeping mode further comprising:

an idle state having all hardware system settings of the computer system being maintained;

a global standby state having settings of a central processing unit and a cache being not maintained;

a suspend to memory state having only hardware settings of a system memory being maintained by being stored in a random access memory; and a suspend to disk state having said all hardware system settings of the computer system being not maintained, said all hardware system settings of the computer system being stored in a disk.

21. The apparatus of claim 20, said selected cooling speed of said first fan unit corresponding to a high speed rapidly cooling said power supply unit when said power mode of the computer system corresponds to said working mode, said selected cooling speed of said first fan unit corresponding to a low speed slowly cooling said power supply unit when said power mode of the computer system corresponds to said global standby state.

22. An apparatus, comprising:

a power supply unit inputting a first power and outputting a plurality of second powers powering a computer system, said power supply unit generating heat;

a first fan unit being positioned to cool said power supply unit;

a central processing unit processing data in the computer system, said central processing unit generating heat;

a second fan unit being positioned to cool said central processing unit; a control unit controlling a power mode of the computer system, said power mode being one selected from among a plurality of different power modes;

a first switching unit being coupled to said control unit and said first fan unit, said first switching unit receiving a control signal from said control unit corresponding to said power mode of the computer system, said first switching unit receiving power driving said first fan unit, said first switching unit controlling a voltage supplied to said first fan unit in response to said control signal, said first fan unit operating at a cooling speed selected from among a plurality of different cooling speeds, said selected cooling speed of said first fan unit being selected in response to the voltage supplied from said first switching unit; and a second switching unit being coupled to said control unit and said second fan unit, said second switching unit receiving said control signal from said control unit corresponding to said power mode of the computer system, said second switching unit receiving power driving said second fan unit, said second switching unit controlling a voltage supplied to said second fan unit in response to said control signal, said second fan unit operating at a cooling speed selected from among a plurality of different cooling speeds, said selected cooling speed of said second fan unit being selected in response to the voltage supplied from said second switching unit.

23. The apparatus of claim 22, said power mode corresponding to one power level selected from among a plurality of power levels comprising:

a power-on mode supplying a full level of electrical power to the computer system for full operational use of the computer system;

a standby mode supplying a first intermediate level of electrical power to the computer system, said first intermediate level of electrical power being below said fill level of electrical power;

a suspend mode supplying a second intermediate level of electrical power to the computer system, said second intermediate level of electrical power being below said first intermediate level of electrical power; and a power-off mode supplying a low level of electrical power to the computer system, said low level of electrical power being below said second intermediate level of electrical power, said power mode of the computer system being converted from said suspend mode to said normal mode in response to a wake-up event corresponding to activity of input/output units.

24. The apparatus of claim 23, further comprising:

a system board portion of the computer system;

said central processing unit, said second fan unit, said control unit, and said second switching unit being installed on said system board unit;

a power supply portion of the computer system; and said power supply unit, said first fan unit, and said first switching unit being installed on said power supply portion.

25. The apparatus of claim 24, said power supply portion further comprising:

an electromagnetic interference filter filtering out noise generated when said power supply unit performs a high frequency wave switching operation; and a supplemental power source not receiving said first power and not receiving said second powers, said supplemental power source supplying power to a circuit detecting the wake-up event to convert said power mode from said suspend mode to said normal mode.

26. The apparatus of claim 22, said power supply unit corresponding to a switching mode power supply unit.

27. The apparatus of claim 26, said selected cooling speed of said first fan unit being different from said selected cooling speed of said second fan unit.

28. The apparatus of claim 27, said power mode corresponding to one mode selected from among a plurality of modes comprising:

a working mode supplying a full level of electrical power to the computer system for full operational use of the computer system;

a sleeping mode corresponding to a first power save state, the computer system being restored to said working mode from said sleeping mode in response to a control signal; and a soft-off mode corresponding to a second power save state, the computer system being restored to said working mode from said soft-off mode while consuming a reduced amount of power in response to a booting of the computer system.

29. The apparatus of claim 26, said power mode corresponding to one power level selected from among a plurality of power levels comprising:

a power-on mode supplying a fill level of electrical power to the computer system for full operational use of the computer system;

a standby mode supplying a first intermediate level of electrical power to the computer system, said first intermediate level of electrical power being below said full level of electrical power;

a suspend mode supplying a second intermediate level of electrical power to the computer system, said second intermediate level of electrical power being below said first intermediate level of electrical power; and a power-off mode supplying a low level of electrical power to the computer system, said low level of electrical power being below said second intermediate level of electrical power, said power mode of the computer system being converted from said suspend mode to said normal mode in response to a wake-up event corresponding to activity of input/output units.

30. The apparatus of claim 29, further comprising:

a system board portion of the computer system;

said central processing unit, said second fan unit, said control unit, and said second switching unit being installed on said system board unit;

a power supply portion of the computer system; and said power supply unit, said first fan unit, and said first switching unit being installed on said power supply portion.

* * * * *